US007995892B2

(12) United States Patent
Bond et al.

(10) Patent No.: US 7,995,892 B2
(45) Date of Patent: Aug. 9, 2011

(54) LOW LOSS, HIGH AND LOW INDEX CONTRAST WAVEGUIDES IN SEMICONDUCTORS

(75) Inventors: Tiziana Bond, Livermore, CA (US); Garrett Cole, Berkeley, CA (US); Lynford Goddard, Champaign, IL (US); Jeff Kallman, Pleasanton, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

(21) Appl. No.: 12/129,503

(22) Filed: May 29, 2008

(65) Prior Publication Data

US 2008/0298761 A1 Dec. 4, 2008

Related U.S. Application Data

(60) Provisional application No. 60/932,754, filed on Jun. 1, 2007.

(51) Int. Cl.
*G02B 6/10* (2006.01)

(52) U.S. Cl. ......... 385/131; 385/132; 385/141; 385/142

(58) Field of Classification Search .................. 385/142, 385/131, 132, 141; 438/31; 257/E21.001
See application file for complete search history.

(56) References Cited

U.S. PATENT DOCUMENTS

| | | | | |
|---|---|---|---|---|
| 5,032,219 | A * | 7/1991 | Buchmann et al. | 438/39 |
| 5,567,980 | A * | 10/1996 | Holonyak et al. | 257/631 |
| 6,560,006 | B2 * | 5/2003 | Sigalas et al. | 359/321 |
| 6,650,816 | B2 * | 11/2003 | Bazylenko et al. | 385/129 |
| 6,998,224 | B1 * | 2/2006 | Kubacki | 430/321 |
| 2002/0110169 | A1 * | 8/2002 | Iwai et al. | 372/43 |
| 2002/0179929 | A1 * | 12/2002 | Takahashi et al. | 257/184 |
| 2005/0089291 | A1 * | 4/2005 | Yamada | 385/129 |
| 2005/0201660 | A1 * | 9/2005 | Grot et al. | 385/12 |
| 2007/0025410 | A1 * | 2/2007 | Agarwal et al. | 372/94 |
| 2007/0120206 | A1 * | 5/2007 | Song et al. | 257/414 |
| 2007/0237442 | A1 * | 10/2007 | Marks et al. | 385/2 |
| 2008/0267239 | A1 * | 10/2008 | Hall et al. | 372/46.013 |

OTHER PUBLICATIONS

Abstract of Ghita et al., "Native oxides on AIGaAs epilayer" Thin Solid Files, vol. 338, No. 1, Jan. 11, 1999, pp. 46-48(3).
Bae et al., "Characteristics of InAIAs/InP and InAlP/GaAs native oxides" Elsevier, www.elesevier.com/locate/sse.
Choquette et al., "Advances in Selective Wet Oxidation of AIGaAs Alloys" IEEE Journal of selected Topics in Quantum Electronics, vol. 3, No. 3, Jun. 1997.
Liang et al., "Reduction of etched AIGaAs sidewall roughness by oxygen-enhanced wet thermal oxidation" Applied Physics Letters 91 061110 (2007).
Sfigakis et al., "Near-Infrared Refractive Index of Thick, Laterally Oxidized AIGaAs Cladding Layers" Journal of Lighwave Technology, vol. 18, No. 2, Feb. 2000.

* cited by examiner

*Primary Examiner* — Ellen Kim
(74) *Attorney, Agent, or Firm* — Eddie E. Scott; James S. Tak

(57) ABSTRACT

A system in one general embodiment includes a waveguide structure comprising a core of an alloy of Group III-V materials surrounded by an oxide (which may include one or more Group III-V metals), wherein an interface of the oxide and core is characterized by oxidation of the alloy for defining the core. A method in one general approach includes oxidizing a waveguide structure comprising an alloy of Group III-V materials for forming a core of the alloy surrounded by an oxide.

33 Claims, 9 Drawing Sheets

LOW LOSS, HIGH AND LOW INDEX CONTRAST WAVEGUIDES IN SEMICONDUCTORS

RELATED APPLICATIONS

This application claims priority to provisional U.S. application Ser. No. 60/932,754 filed on Jun. 1, 2007, which is herein incorporated by reference.

The United States Government has rights in this invention pursuant to Contract No. DE-AC52-07NA27344 between the United States Department of Energy and Lawrence Livermore National Security, LLC for the operation of Lawrence Livermore National Laboratory,

FIELD OF THE INVENTION

The present invention relates to waveguides, and more particularly to low loss, high index contrast waveguides in semiconductors.

BACKGROUND

Current waveguide technologies exhibit losses on the order of 100-200 dB/m the causes of loss are myriad, and include insertion losses, presence of impurities in the waveguide, bend losses, scattering losses caused by sidewall surface roughness, etc.

For example, the scattering of light from rough sidewall surfaces in semiconductor optical rib waveguides is a primary source of wave propagation loss. Photolithography and anisotropic dry-etching fabrication processes transfer photo mask line edge roughness and may introduce additional roughness to the etched sidewalls used to define the lateral effective index contrast, $\Delta\eta_{eff}$, required to confine an optical mode. Theoretical and experimental studies of scattering loss $\alpha$ show that $\alpha$ typically scales with $(\Delta\eta_{eff})^2$ or $(\Delta\eta_{eff})^3$, $\sigma^2$, and $1/d^4$, where $\sigma$ and d represent the root-mean-squared surface roughness and waveguide horizontal dimension, respectively. To achieve high-density photonic integration, a high index contrast (HIC) is required to achieve small radius of curvature bent waveguides with low bend loss, which in turn necessitates a reduction in d to maintain single mode operation. Given the clear fundamental tradeoff between reduced bend size and increased scattering loss, minimizing the sidewall roughness $\sigma$ becomes perhaps the most critical challenge to achieving a viable photonic integration technology.

SUMMARY

A system in one general embodiment includes a waveguide structure comprising a core of an alloy of Group III-V materials surrounded by an oxide (which may include one or more Group III-V metals), wherein an interface of the oxide and core is characterized by oxidation of the alloy for defining the core.

A system in one general embodiment includes a waveguide structure comprising alloys of Group III-V elements having a core of AlYAs (which may include additional Group III-V materials such as nitrogen (N), antimonide (antimony) (Sb), etc.) surrounded by $AlO_x$ (which may include additional materials such as Y, As, N and Sb), where Y is selected from a group consisting of gallium (Ga), aluminum (Al), N, arsenic (As), Sb, and indium (In).

A system in another general approach includes a waveguide structure having a core of YAs surrounded by $AlO_x$ where Y in each of the materials is independently selected from a group consisting of Ga and In. In other words, Y can be Ga or In for both materials, or Y can be Ga in the core and In in the cladding or vice versa.

A method in one general approach includes oxidizing a waveguide structure comprising an alloy of Group III-V materials for forming a core of the alloy surrounded by an oxide.

A method in another general approach includes oxidizing a waveguide structure comprising AlYAs for forming a core of AlYAs surrounded by $AlO_x$, where Y comprises one or more of Ga, In, N, and Sb.

A method in yet another general approach includes oxidizing a waveguide structure having a core of YAs surrounded by AlYAs for forming a core of YAs surrounded by $AlO_x$, where Y in each of the materials is independently selected from a group consisting of Ga and In. In other words, Y can be Ga in the core and In in the cladding surrounding the core.

A system in yet another general approach includes a Si-containing waveguide structure having an oxidized portion surrounding at least a portion of an unoxidized core, an interface between the oxidized portion and the core being defined by an extent of oxidation of the oxidized portion.

A method in a further general approach includes oxidizing a pedestal of Si for forming a core of unoxidized Si surrounded on all sides by oxidized Si.

A method in yet another general approach includes masking a core region of a layer of Si formed above an insulator layer, and oxidizing exposed areas of the layer of Si for forming a core of unoxidized Si surrounded on at least two sides by oxidized Si.

Other aspects and embodiments of the present invention will become apparent from the following detailed description, which, when taken in conjunction with the drawings, illustrate by way of example the principles of the invention.

DETAILED DESCRIPTION

Figure 1C:
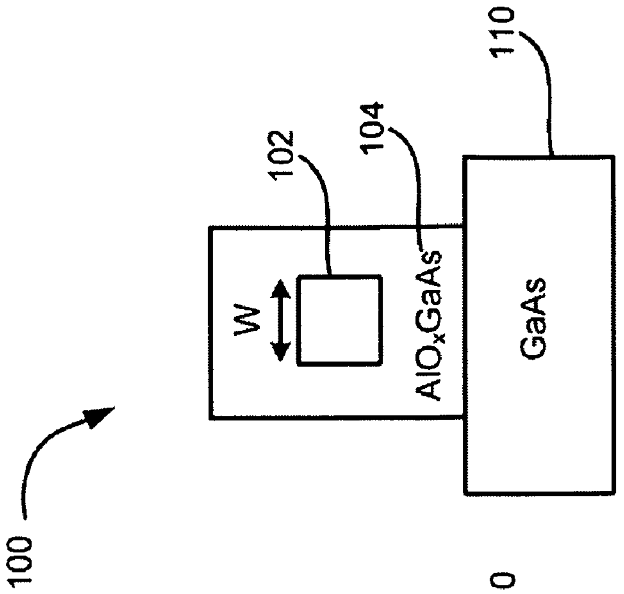
FIGS. 1A-1C illustrate fabrication of a waveguide structure having a core of AlGaAs surrounded by $AlO_x$.

The following description is made for the purpose of illustrating the general principles of the present invention and is not meant to limit the inventive concepts claimed herein. Further, particular features described herein can be used in combination with other described features in each of the various possible combinations and permulations.

Unless otherwise specifically defined herein, all terms are to be given their broadcast possible interpretation including meanings implied from the specification as well as meanings understood by those skilled in the art and/or as defined in dictionaries, treaties, etc.

It must also be noted that, as used in the specification and the appended claims, the singular forms “a,” “an” and “the” include plural referents unless otherwise specified.

The following description provides new very simple techniques for fabricating high index contrast waveguides with low insertion losses, as well as systems including the resultant structures. The teachings presented herein also provide new procedures for shrinking the optical fiber on a chip, and to create nano-ribbons which would be of great use in compacting the size of networking systems, reducing delays and latencies, and manipulating dispersions. Modifications to the basic approach make it universal since any index-contrast, any shape, size, form of guiding rails can be engineered.

A system in one general embodiment includes a waveguide structure comprising a core of an alloy of Group III-V materials surrounded by an oxide (which may include one or more Group III-V metals), wherein an interface of the oxide and core is characterized by oxidation of the alloy for defining the core.

A system in one general embodiment includes a waveguide structure comprising alloys of Group III-V elements having a core of AlYAs (which may include additional Group III-V materials such as nitrogen (N), antimonide (antimony) (Sb), etc.) surrounded by $AlO_x$ (which may include additional materials such as Y, As, N and Sb), where Y is selected from a group consisting of gallium (Ga), aluminum (Al), N, arsenic (As), Sb, and indium (In).

A system in another general approach includes a waveguide structure having a core of YAs surrounded by $AlO_x$ where Y in each of the materials is independently selected from a group consisting of Ga and In. In other words, Y can be Ga or In for both materials, or Y can be Ga in the core and In in the cladding or vice versa.

A method in one general approach includes oxidizing a waveguide structure comprising an alloy of Group III-V materials for forming a core of the alloy surrounded by an oxide.

A method in another general approach includes oxidizing a waveguide structure comprising AlYAs for forming a core of AlYAs surrounded by $AlO_x$ where Y comprises one or more of Ga, In, N, and Sb.

A method in yet another general approach includes oxidizing a waveguide structure having a core of YAs surrounded by AlYAs for forming a core of YAs surrounded by $AlO_x$, where Y in each of the materials is independently selected from a group consisting of Ga and In. In other words, Y can be Ga in the core and In in the cladding surrounding the core.

A system in yet another general approach includes a Si-containing waveguide structure having an oxidized portion surrounding at least a portion of an unoxidized core, an interface between the oxidized portion and the core being defined by an extent of oxidation of the oxidized portion.

A method in a further general approach includes oxidizing a pedestal of Si for forming a core of unoxidized Si surrounded on all sides by oxidized Si.

A method in yet another general approach includes masking a core region of a layer of Si formed above an insulator layer, and oxidizing exposed areas of the layer of Si for forming a core of unoxidized Si surrounded on at least two sides by oxidized Si.

Systems Based on Alloys of Group III-V Materials

One benefit of the methodology presented herein is that fabrication of waveguides is relatively easy. For example, contact lithography may be used in some embodiments. Also, wet (thermal) oxidation can be used to perform both vertical and lateral oxidation. Exposure to ambient oxygen may also be used to cause unselective oxidation. This latter case is particularly useful in embodiments where Al is not present.

Additionally, the waveguides may be tailored to suit specific needs. For instance, as discussed more fully below, the shape of the core can be controlled by controlling oxidation speed, which, where Al is present for example, is a function of Al concentration (x), temperature (T), and oxidation time (t) and $O_2$ concentration. Also, as noted below, laminates of varying composition provide a measure of control. Thus, the core may have cross sectional shapes such as circular, oval, square, rectangular, etc. Further, waveguides may be made to be polarization selective.

As alluded to above, scattering losses are low due to smoothening of the etched sidewall by the oxidation front, which defines the core. This leads to extremely low scattering loss despite high index contrast (Δn). Additionally, the index contrast (Δn) can be controlled to be higher than about 40%, resulting in extremely low bending loss.

It should be noted that while much of the following description will be described in terms of AlGaAs rather than for each of the many possible combinations of materials, this is done by way of example only and in no way should be construed as limiting.

Systems Based on AlYAs, where Y is Ga and/or In

One approach is based on a combined full and partial oxidation of AlGaAs or AlInAs with different aluminum concentrations in different portions of the initial structure. The higher-Al-concentration portion(s) oxidize faster and constitute the bottom and/or top and/or side claddings of the waveguides. The lower-Al-concentration portion(s) oxidize more slowly and leave a core area essentially untouched, but surrounded by the oxidized materials. By designing the thickness of the layers, a buried channel (elongated core) can be fabricated. Preferably, losses are comparable or lower than 0.1 dB/km, as in standard optical fibers. Absorption and bending losses are negligible. Scattering losses are low due to smoothening of the etched sidewall by the oxidation front.

Again, in any of the embodiments presented herein, additional Group III-V materials may be present in the core.

Figure 1B:
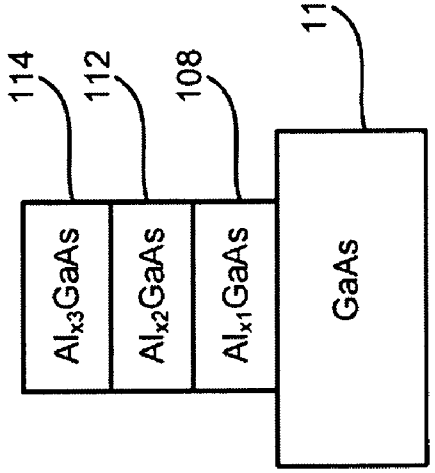
Figure 1A:
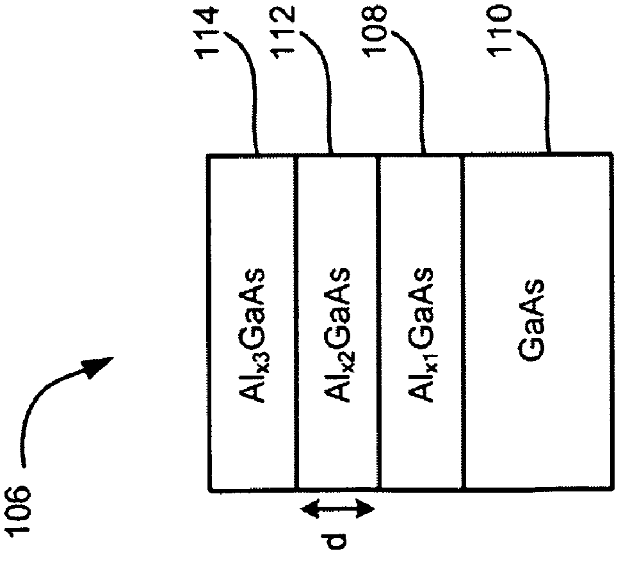

FIGS. 1A-C illustrate fabrication of a waveguide structure 100 having a core 102 of AlGaAs (which may include additional materials, as noted above) surrounded by $AlO_xGa_{1-x}As$ 104 (which may include additional materials, as noted above). Referring to FIG. 1A, the initial structure 106 is created by forming a first layer 108 of $Al_{x1}Ga_{1-x1}As$ on a substrate 10, where x1 represents a concentration of Al in the AlGaAs. The substrate may be seed layer formed over another substrate such as a thin film chip, wafer, etc.; be a lone layer; etc. In the example shown, the substrate comprises GaAs, which aids in epitaxial growth of the overlying layers.

A layer 112 of $Al_{x2}Ga_{1-x2}As$ is formed above the first layer to a thickness d, where d may be selected based on the desired dimensions of the core. Next, a layer 114 of $Al_{x3}Ga_{1-x3}As$ is formed above the layer of $Al_{x2}Ga_{1-x2}As$. Note that x3 may be the same as x1, or higher or lower. So that the middle layer oxidizes more slowly, x2 is preferably less than x1 and x3. Illustrative values for x1, x2 and x3 are about 0.95 to about 0.90, about 0.90 to about 0.80, and about 0.95 to about 0.90, respectively. Note that the actual values used in a given embodiment may be higher or lower than the ranges set forth therein.

Any known method of epitaxial growth may be used to form the various layers 108, 112, 114. Illustrative methods include Molecular Beam Epitaxy (MBE), Chemical Vapor Deposition (CVD) such as Metal Organic Chemical Vapor Deposition (MOCVD), Ion Beam Deposition (IBD), etc.

In a variation, the second layer 112 may be formed of a laminate, e.g., of alternating AlGaAs/GaAs layers. Laminated layers may prevent delamination and reduce the effects of internal strain. Also, thermal treatments such as annealing may be used to prevent delamination and reduce internal strain, e.g., by improving the epitaxiality of the layers.

The structure of FIG. 1A is processed to define a width ($W_{track}$) of the structure, resulting in the structure shown in FIG. 1B. Standard contact lithography techniques may be used. In one approach, the structure of FIG. 1A may be masked using standard photolithographic techniques, the mask defining $W_{track}$. The masked structure is then etched to remove unmasked regions of the structure.

The structure is then exposed to an oxidative environment to create the waveguide structure of FIG. 1C, which includes the core 102 surrounded by $AlO_x$ 104. Particularly, the higher Al concentration of the first and third layers 108, 114 causes them to oxidize more rapidly than the second layer 112. As the oxidation front moves through the structure, it defines the core. Accordingly, a volumetric concentration of AlOx adjacent the core in the second layer is expected to be lower than a concentration of the AlOx in the other layers of the structure. As alluded to, some Ga and As may also be present in the oxide layer, and may or may not be present as an oxidation product.

As mentioned above, the width W of the core can be controlled by adjusting one or more of the Al concentration in the second layer 112, the temperature, and the oxidation time. In general, the higher the concentration of Al, the faster the oxidation thereof. The higher the temperature, the faster the oxidation. The longer the oxidation time, the greater the extent of oxidation. Accordingly, the core width may vary, and thus may be the same or different than the thickness of the core in a direction perpendicular to the width.

In one example, using FIGS. 1A-1C as the structure, assume that the thickness d of the second layer 112 is about 500 nanometers (nm) and $W_{track}$ is about 2000 nm. Next, assume x1=x3=0.90, and x2=0.88. The structure of FIG. 1B is wet oxidized for 1 hour at 420° C. The first and third layers 108, 114 are fully oxidized, while the second layer 112 is partially oxidized. The resultant core has dimensions of W~d~500 nm and a Δn>40%. Absorption and bending losses are negligible. Where $n_i$ of the core is about $10^{14}$ $cm^{-3}$, overall losses are <1 dB/m.

Figure 2:
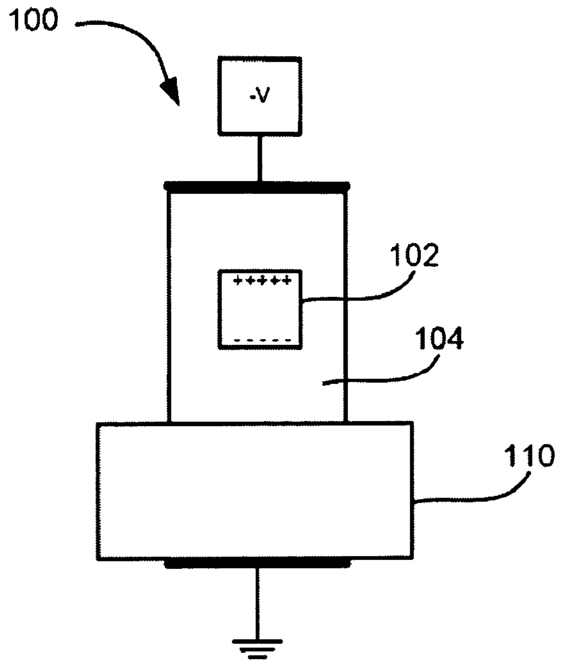
FIG. 2 illustrates application of an electric field for sweeping carriers out of the core of FIG. 1C.

FIG. 2 illustrates how an electric field may be applied for sweeping carriers out of the core of FIG. 1C. As shown, a static electric field is induced by applying opposite electrical polarities to the top and bottom of the structure. The $AlO_x$ layers act as insulators, causing the carriers to accumulate at the interfaces along the core. A greater than 100× reduction in loss due to reduced overlap is expected.

By introducing grading between the core and cladding epilayers, a smoother, graded confining structure may be made to assimilate a more (micro/nano) fiber shape. Additionally, by introducing chirped superlattices in both the clad and the core regions, any kind of refractive index steps, any dimensions, and any shape can be designed, the flexibility of it depending vertically primarily on the growth techniques that can control the thicknesses of the various layers to atomic levels, and laterally primarily on oxidation speed that can instead be controlled by manipulating temperature, time and Al concentration. This approach could be extended to AlInAs/InP heterostructures.

Figure 3A:
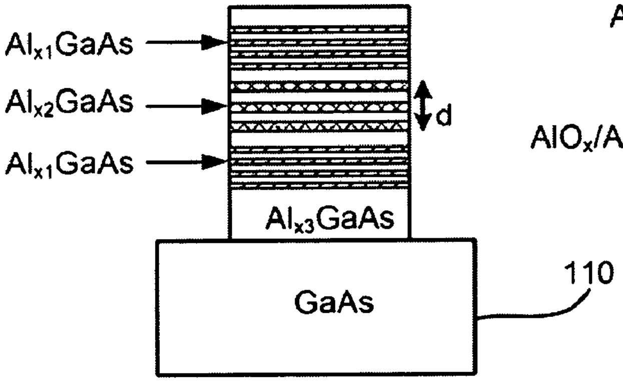
FIGS. 3A and 3B illustrate a method according to an embodiment using graded and chirped superlattices to form a waveguide structure.
Figure 3B:
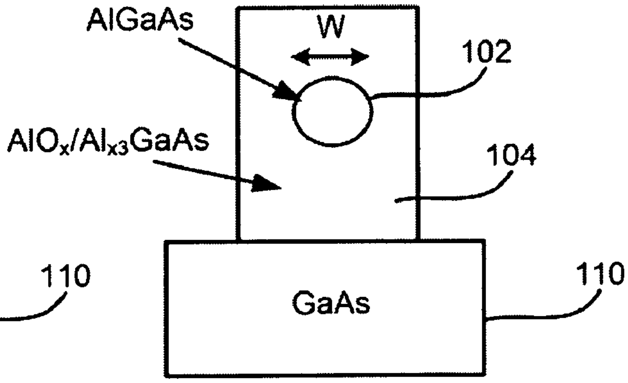

FIGS. 3A and 3B illustrate an embodiment using graded and chirped superlattices to form a waveguide structure. Unless otherwise described, the processing parameters of FIGS. 1A-1C may be used. As shown in FIG. 3A, the structure is formed of laminated layers of $Al_{x1}GaAs$, $Al_{x2}GaAs$, and $Al_{x3}GaAs$ on a substrate 110. Particularly, the cladding region includes layers of $Al_{x1}GaAs$ and $Al_{x3}GaAs$, while the core region includes layers of $Al_{x2}GaAs$ and $Al_{x3}GaAs$. In this approach, x1 is preferably higher than x2 so that the portions above and below the target area for the core oxidize faster. x3 may be lower than x2.

Referring next to FIG. 3B, the structure of FIG. 3A is exposed to an oxidative environment to form a core of AlGaAs surrounded by $AlO_x$, thereby forming the structure of FIG. 3B.

Figure 6:
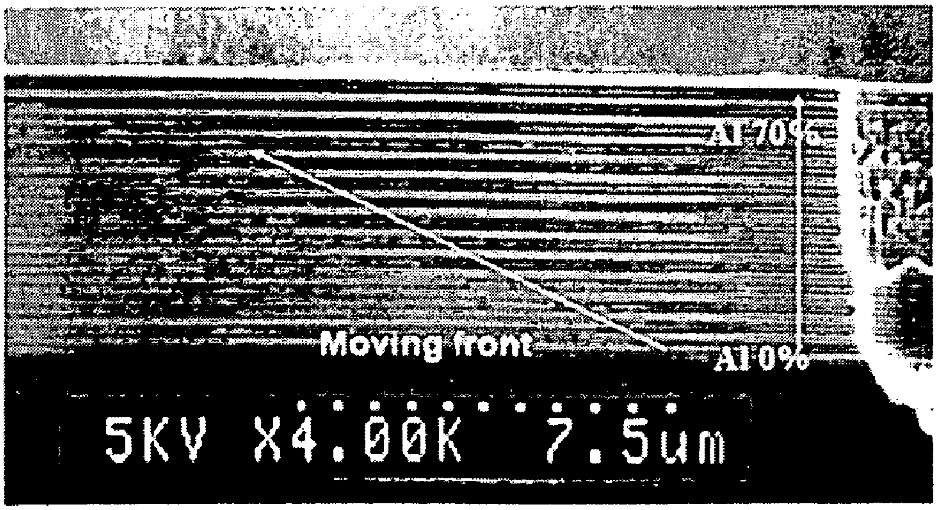
FIG. 6 is an SEM image showing the progression of oxidation in a laminate structure having a graded Al content.

FIG. 6 illustrates the progression of oxidation in a laminate structure having a graded Al content. As shown, the speed of oxidation of the laminates increases as the Al content increases.

In one example, using FIGS. 3A and 3B as the structure, assume that the thickness d of the target area for the core is about 2000 nm and $W_{track}$ is about 5000 nm. Next, assume x1=0.90, x2=0.88, and x3=0.75. The structure of FIG. 3A is wet oxidized. The resultant core has dimensions of W~d~2000 nm and a Δn of about 5%. Absorption and bending losses are negligible. The mode size, however, is 16× larger than that of the example presented above with relation to FIGS. 1A-1C. The higher mode size results in easier coupling and reduced nonlinear effect.

As noted above, for embodiments where the $n_i$ of the core is about $10^{14}$, overall losses are <1 dB/m. By forming a core of substantially Al-free GaAs, to push $n_i$ to about $10^{12}$, overall losses are reduced to <1 dB/km.

Figure 4A:
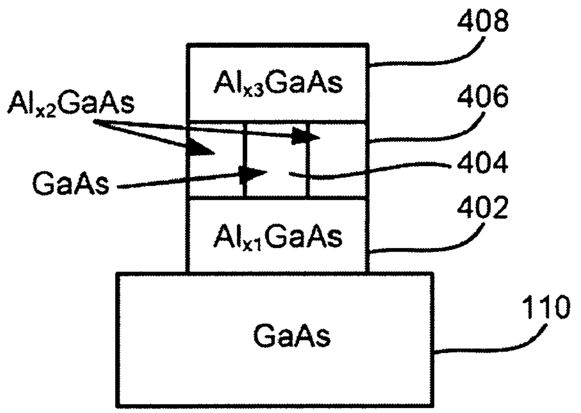
FIGS. 4A and 4B illustrate a method according to another embodiment where the core is substantially Al-free GaAs.
Figure 4B:
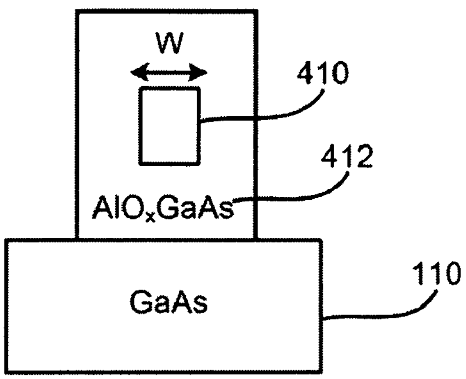

FIGS. 4A and 4B illustrate another embodiment where the core is substantially Al-free GaAs. Unless otherwise described, the processing parameters of FIGS. 1A-3B may be used. Referring to FIG. 4A, a first layer 402 of $Al_{x1}GaAs$ is formed above a substrate 110.

Next, using lithography and deposition techniques, a core region 404 of GaAs flanked by $Al_{x2}GaAs$ 406 is formed. In one approach, the core region may be deposited full film, then trimmed to the desired width e.g., using masking and etching and the $Al_{x2}GaAs$ added. In another approach, the $Al_{x2}GaAs$ may be formed full film, a trench formed therein e.g., using masking and etching, and the GaAs formed in the trench. Other approaches may also be used. An illustrative masking material is $Si_3N_4$.

A third layer 408 of $Al_{x3}GaAs$ is formed above the previously-formed layers. As above, x3 may be the same as x1, or higher or lower. So that the middle layer oxidizes more slowly, x2 is preferably less than x1 and x3.

The structure of FIG. 4A is exposed to an oxidative environment to form a core 410 of GaAs surrounded by $AlO_x$ 412, as shown in FIG. 4B.

In one example, using FIGS. 4A and 4B as the structure, assume that the thickness d of the target area for the core is about 500 nm and $W_{track}$ is about 2000 nm. Next, assume x1=x3=0.90, and x2=0.88. The structure of FIG. 4A is wet oxidized. The resultant core has dimensions of W~d~500 nm and a Δn of >50%. Absorption and bending losses are negligible.

Figure 5A:
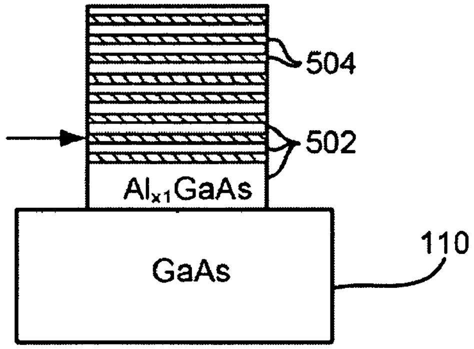
FIGS. 5A-5C illustrate a method according to an embodiment where the core region is predefined by intermixing a core region of a laminate structure.
Figure 5B:
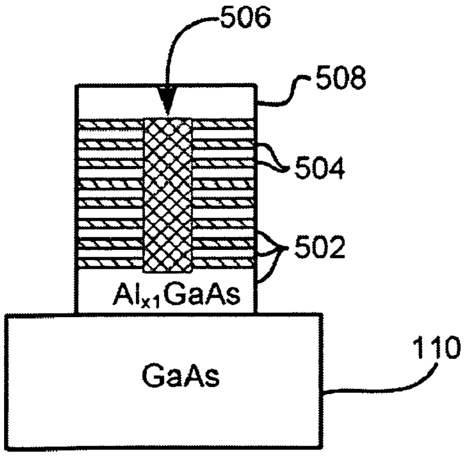
Figure 5C:
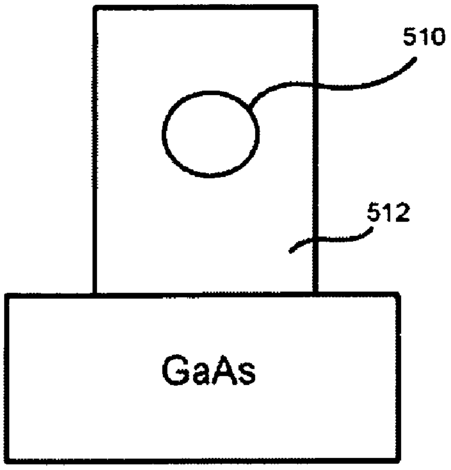

FIGS. 5A-5C illustrate an embodiment where the core region is predefined by intermixing a core region of a laminate structure. Unless otherwise described, the processing parameters of FIGS. 1A-4B may be used. Referring to FIG. 5A, alternating layers of $Al_{x1}GaAs$ 502 and GaAs 504 are formed above a substrate 110. Referring to FIG. 5B, intermixing of the layers in the target area 506 for the core is induced. The intermixing may be caused by ion bombardment, electron implantation, or other technique. A mask may be used to prevent intermixing of masked regions. After causing intermixing, a top cladding layer 508 may be added. The top cladding layer may have a same composition as the $Al_{x1}GaAs$ laminated layers, or a different composition.

The structure of FIG. 5B is exposed to an oxidative environment to form a core 510 surrounded by oxidized (and possibly some unoxidized) material 512, as shown in FIG. 5C.

It should be noted that while the embodiments described above illustrate creation of a single waveguide, it will be readily apparent that arrays of waveguides may be formed on a common substrate, and that by varying processing parameters during fabrication, some or all of the waveguides on a single platform may be different than others.

Further, as implied, axial lengths of the waveguides are limited only by the processes used to fabricate them. Accordingly, waveguides of any length can be made.

Wet Thermal Oxidation

As noted above, one preferred mode to oxidize the various layers is by wet thermal oxidation. The following presents one possible method for wet thermal etching.

The use of oxygen-enhanced wet thermal oxidation results in a substantial (up to about 100 times) reduction of etched sidewall roughness in low Al content AlGaAs as may be employed in various embodiments. The semiconductor oxidation smoothing mechanism discussed below enables high efficiency of devices such as a high index contrast (HIC) ($\Delta\eta_{eff}$~1.7) ridge waveguide injection laser devices and their ability to support resonators with compact waveguide bends as small as r=10 μm radius of curvature.

The heteroepitaxial structure used in this example for etching and oxidation smoothing studies has a 1.5 μm thick unintentionally doped $Al_{0.3}Ga_{0.7}As$ layer grown on a GaAs buffer and substrate by metal-organic chemical-vapor deposition. Ridge structure fabrication begins with contact lithography to pattern 5 μm wide stripes in photoresist, followed by reactive ion etching (RIE) in a $BCl_3/Cl_2/Ar$ gas mixture. After removing the photoresist and freshening the etched surface in 1:4 HCl:H2O, samples undergo wet thermal oxidation in a conventional wet thermal oxidation gas ambient (obtained by bubbling 0.67 l/min ultrahigh purity $N_2$ carrier gas through a 95° C. $H_2O$ bubbler) or an oxygen-enhanced water vapor obtained by mixing in 7000 ppm, i.e., 0.7%, $O_2$ relative to the $N_2$ carrier gas. Etch staining is conducted (1:1:10 $HCl{:}H_2O_2{:}H_2O$ for 5 s) to enhance the image contrast in subsequent scanning electron microscope (SEM) imaging.

Figure 7:
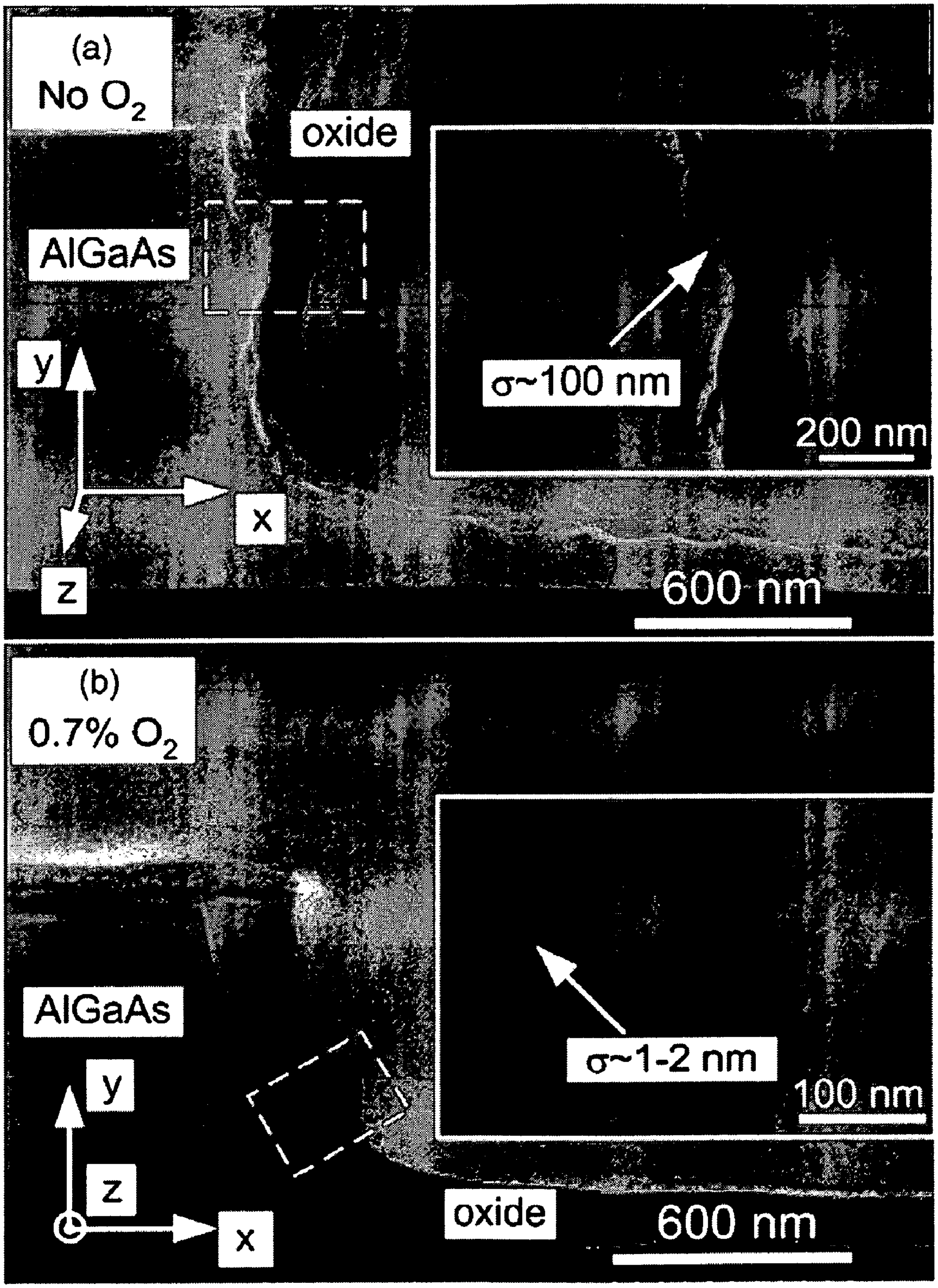
FIG. 7 shows SEM cross-sectional images of dry-etched $Al_{0.3}Ga_{0.7}As$ ridges after wet thermal oxidation for 20 min at 450° C. in (a) conventional $N_2$+$H_2O$ and (b) $O_2$-enhanced (7000 ppm $O_2/N_2$ ratio) gas ambient. Insets: high magnification SEM images showing the semiconductor/oxide interface roughness after oxidation. Sidewall roughness is reduced up to 100 fold in (b) relative to (a).

FIG. 7 shows the cross-section view (x-y plane) of (a) conventional versus (b) $O_2$-enhanced wet thermal oxidation of an etched $Al_{0.3}Ga_{0.7}As$ ridge structure (both for 20 min at 450° C.). Approximately 60 and 200 nm of native oxide is grown in the conventional and $O_2$-enhanced processes, respectively. The thicker oxide in FIG. 7(*b*) results from the oxidation rate enhancement due to $O_2$ participation. The SEM images clearly show that for $O_2$-enhanced wet oxidation, the initial rough sidewall features of σ~100 nm dimension are smoothed away at the inward progressing oxidation front, resulting in an apparent final sidewall roughness (x-y plane) as low as σ~1-2 nm [see high magnification inset to FIG. 7(*b*)]. In contrast, with no added $O_2$ (i.e., conventional wet oxidation) [FIG. 7(*a*)], the rough sidewall features do not disappear for the same oxidation time and an even rougher interface results. Similar results have been obtained on $Al_{0.5}Ga_{0.5}As$ samples, and we have shown that even for comparably thick oxides no smoothing occurs under conventional wet oxidation. In general, conventional wet oxides of low Al-content AlGaAs are of inferior quality to those grown via $O_2$-enhanced wet oxidation, as indicated by greater dissolution in the stain etch seen in FIG. 7(*a*), much lower refractive index (1.45-1.5 vs 1.65-1.7) and poorer adhesion.

Figure 8:
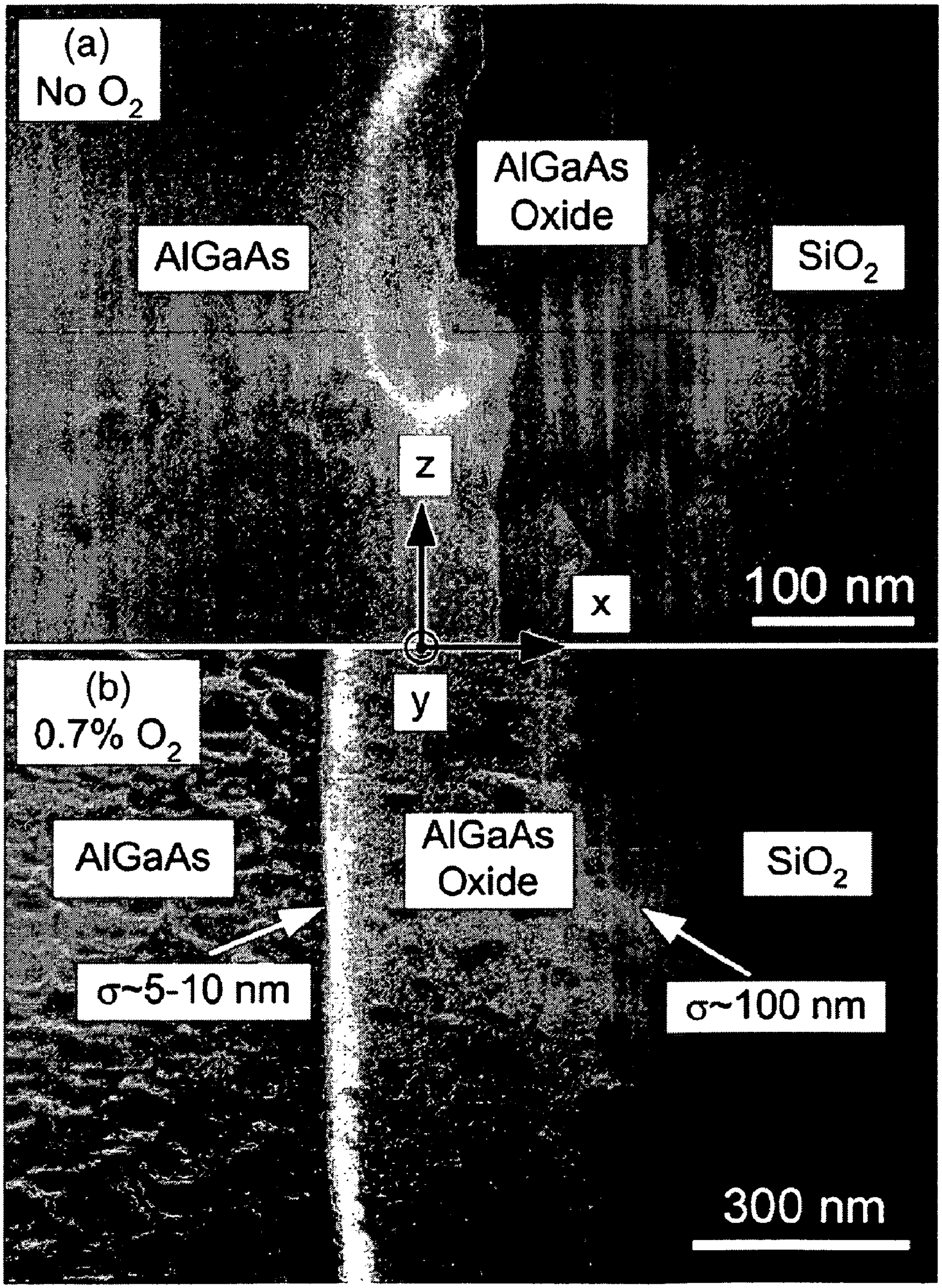
FIG. 8 shows top-view (x-z plane) SEM images of oxide/semiconductor interface resulting after wet oxidation (a) without and (b) with 7000 ppm added $O_2$, showing 10-20 times roughness reduction along an etched $Al_{0.3}Ga_{0.7}As$ ridge. The $SiO_2$ encapsulant layer serves to preserve the original outer oxide/air interface during polishing.

While the images in FIG. 7 demonstrate smoothing in a cross sectional view (x-y plane), for ridge waveguide structures the smoothness of the interface along the propagation direction [z axis (into the page on FIG. 7)] determines the scattering loss. FIG. 8 shows top view (x-z plane) images of the oxide/semiconductor ($Al_{0.3}Ga_{0.7}As$) interfaces formed (a) without and (b) with [FIG. 8(*b*)] added $O_2$. The specimens were prepared by encapsulating the etched and oxidized ridge with 1 μm of plasma-enhanced chemical-vapor deposition $SiO_2$ to protect the rough outer interface, followed by careful lapping and polishing and subsequent light etch staining as above. As in FIG. 7, FIG. 8(*a*) shows no smoothing occurring for conventional wet oxidation, while FIG. 8(*b*) shows that a significant reduction in the sidewall roughness (from σ~100 nm down to a relatively long period, σ~5-10 nm modulation) is achieved for $O_2$-enhanced wet oxidation. The nonuniform AlGaAs surface and particles seen on the oxide in FIG. 8(*b*) are remnants of the polishing process. The use of a hard dielectric mask (e.g., silicon dioxide or silicon nitride), which generally leads to improved sidewalls over photoresist masking, may make a further reduction in the sidewall roughness possible.

Figure 9:
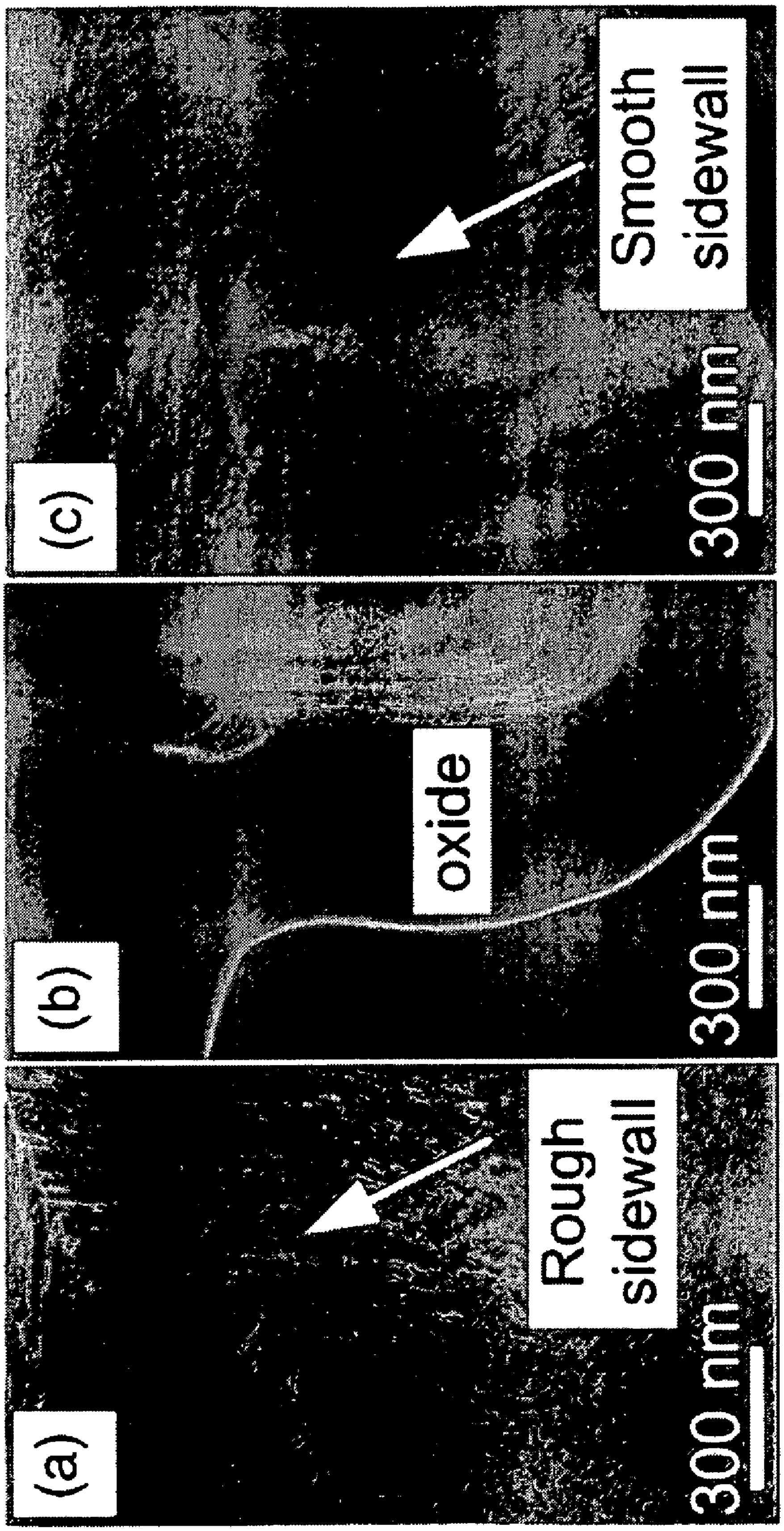
FIG. 9 shows SEM images of dry-etched $Al_{0.3}Ga_{0.7}As$ ridge structure (a) before oxidation, (b) after 20 min, 450° C. $O_2$-enhanced wet oxidation (7000 ppm $O_2$), and (c) after selective oxide removal in 1:10 BHF:$H_2O$ solution for 15 min to reveal oxidation-smoothed interface.

The native oxides of $Al_{0.3}Ga_{0.7}As$ studied here have been found to be soluble in a dilute buffered HF (e.g., BHF) solution with good selectivity against unoxidized $Al_{0.3}Ga_{0.7}As$. SEM images in FIG. 9 show (a) an unoxidized dry etched $Al_{0.3}Ga_{0.7}As$ ridge, (b) after 20 min $O_2$-enhanced wet oxidation at 450° C. with 7000 ppm $O_2$, and (c) after etching off the oxide in 1:10 BHF:$H_2O$ for 15 min. The rough outer $Al_{0.3}Ga_{0.7}As$/air interface shown before oxidation in FIG. 9(*a*) remains rough in appearance as the outer oxide/air interface shown in FIG. 9(*b*) following oxidation. However, the inner $Al_{0.3}Ga_{0.7}As$/air interface observed in FIG. 9(*c*) after the oxide is selectively removed shows that the $O_2$-enhanced oxide growth has led to substantial sidewall roughness reduction along the entire ridge. The spongelike features on the $Al_{0.3}Ga_{0.7}As$ surface in FIG. 9(*c*) are believed to be remnants of unremoved oxide.

Figure 10:
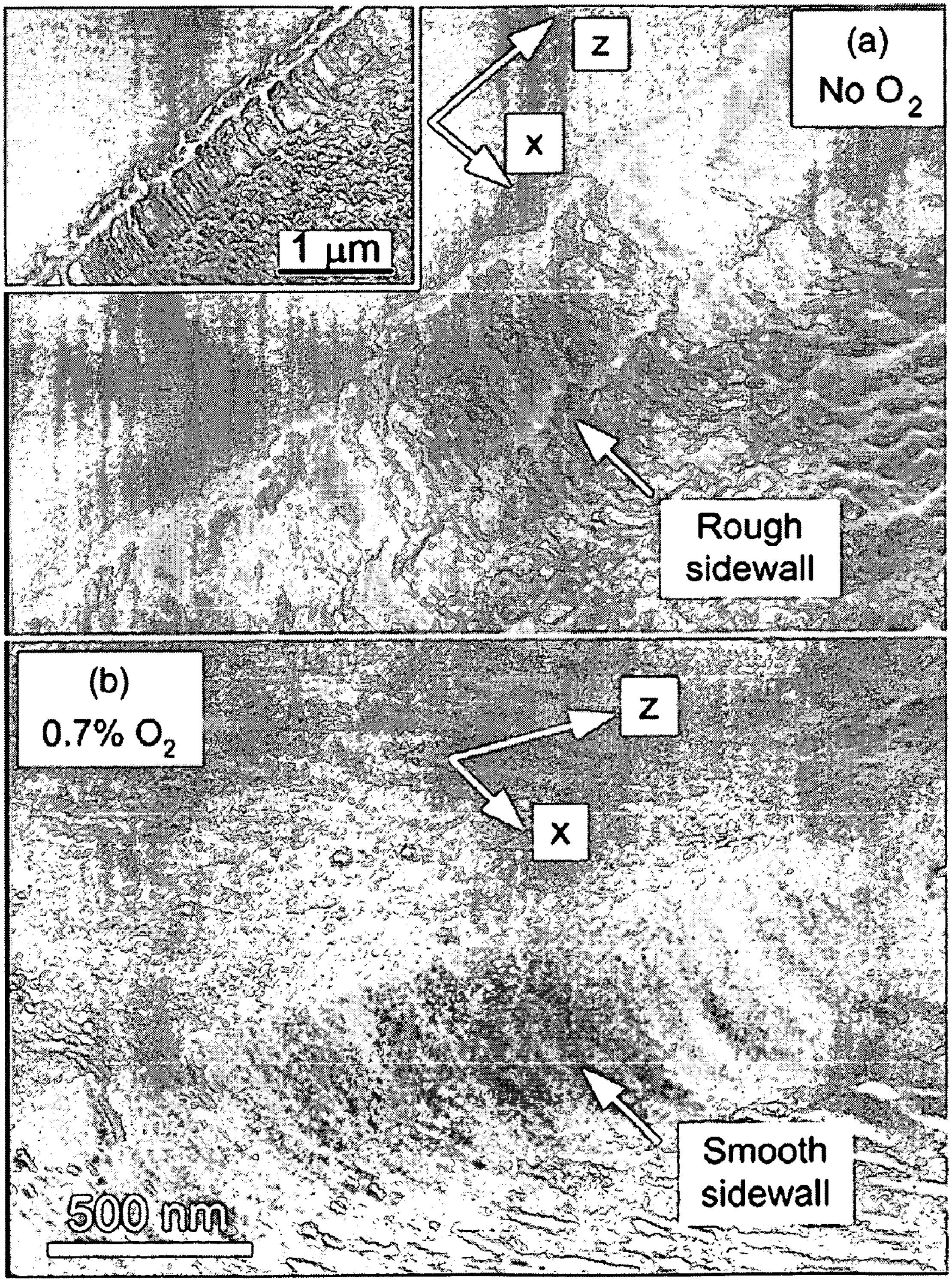
FIG. 10 shows SEM images of shallow dry-etched $Al_{0.3}Ga_{0.7}As$ ridge structures wet oxidized at 450° C. for 45 min (a) without and (b) with added $O_2$ (7000 ppm), shown after selective oxide removal in 1:10 BHF:$H_2O$ for 75 min. The inset shows 500 nm tall ridge structure formed via RIE before oxidation. Image (a) demonstrates the absence of smoothing in the BHF solution.

In order to verify that the observed smoothing is solely due to the $O_2$-enhanced wet oxidation process and not isotropic smoothing of the AlGaAs by the dilute BHF solution, four $Al_{0.3}Ga_{0.7}As$ samples with surfaces intentionally roughened via RIE are left in the dilute BHF for 5, 30, 45, and 75 min, respectively. No surface improvement (i.e., smoothing) or degradation (i.e., roughening) is observed in SEM images (not shown), eliminating the possibility that the BHF might play a role in the observed smoothing shown in FIG. 9(*c*). This is also confirmed by the SEM images in FIG. 10 which show shallow-etched $Al_{0.3}Ga_{0.7}As$ (inset) oxidized at 450° C. for 45 min by (a) conventional oxidation and (b) $O_2$-enhanced wet oxidation, following immersion in the dilute BHF for 75 min to completely etch off the oxide. Because the sidewall roughness is not reduced except through the participation of $O_2$ during wet oxidation, the rough outer sidewall in FIG. 10(*a*) remains unchanged from that of the original outer surface roughness (inset), confirming the absence of smoothing by the BHF. A dramatically different result is observed in FIG. 10(*b*), where substantial sidewall oxidation smoothing has occurred during the $O_2$-enhanced growth of ~520 nm of oxide. The flat and smooth GaAs cap layer in FIG. 10(*a*) also shows the lack of any reaction of the GaAs cap layer to the conventional oxidation ambient and subsequent dilute BHF wet etch. In contrast, the similar top and sidewall surfaces in FIG. 10(*b*) show that the relatively nonselective $O_2$-enhanced wet thermal oxidation process also converts the GaAs cap layer into an oxide which is then removed by the BHF solution.

Si-containing Structures

In additional embodiments, $Si/SiO_x$ waveguides are created, where a Si core is surrounded by $SiO_x$.

In one illustrative approach, the waveguide is produced by etching a trench followed by thermal deep oxidation, on a substantially pure silicon wafer or portion of a chip. In another approach, the waveguide is formed by patterning a channel on a Silicon-on-Insulator wafer or portion of a chip and oxidizing around it. Besides advantages similar to those previously discussed, such as reduction form micro scale to nano scale features, these waveguides would be directly CMOS compatible.

As in the previous embodiments the extent of oxidation may be used to control waveguide geometry. Accordingly, micron-scale linewidths may be reduced to nanoscale waveguides. Further, the oxidation process reduces the roughness induced by etching. Also, the Si-containing waveguides can be fabricated using standard contact lithography. Further, high temperature oxidation and/or annealing anneal may be employed to reduce strain in thick oxide layers.

FIGS. 11A-D illustrate a process for forming a Si-containing waveguide structure 1100 having an oxidized portion 1104 surrounding at least a portion of an unoxidized core 1102, an interface between the oxidized portion and the core being defined by an extent of oxidation of the oxidized portion.

Figure 11A:
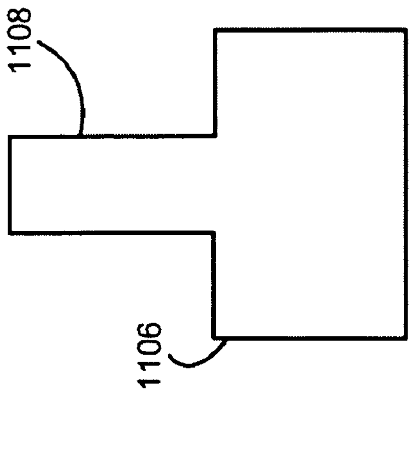
FIGS. 11A-D illustrate a process for forming a Si-containing waveguide structure according to one embodiment.
Figure 11B:
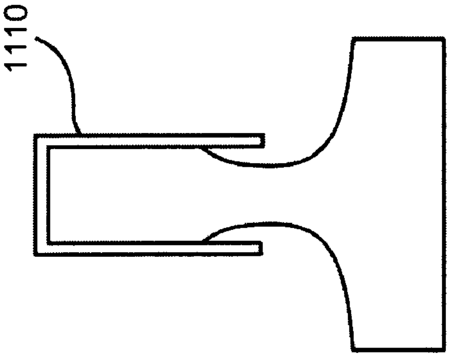
Figure 11C:
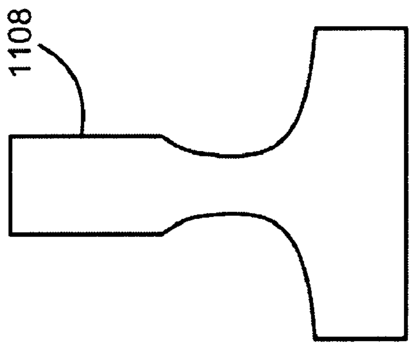
Figure 11D:
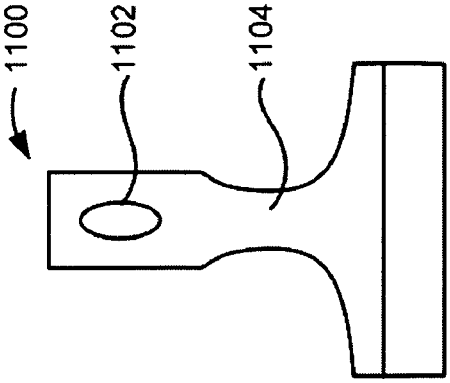

As shown in FIG. 11A, a silicon substrate 1106 is trenched to form a pedestal 1108. Again, any type of subtractive process may be used. Referring to FIG. 11B, a mask 1110 is formed above or on a portion of the pedestal. In one approach, the mask may be formed by oxidizing the structure to form an oxide mask. “Floor cleaning” is then performed for exposing unoxidized portions of the structure. In another approach, a mask may be added, e.g., by full film deposition, optionally followed by floor cleaning. The partially-masked structure is then etched, e.g., isotropically etched to reduce a thickness of the neck of the pedestal. The mask is removed, resulting in the structure of FIG. 11C. The structure is then oxidized to define the core. As shown, the narrowed neck of the pedestal may oxidize completely therethrough.

FIGS. 12A-D illustrate a process for forming a Si-containing waveguide structure 1200 having an oxidized portion 1202 surrounding at least a portion of an unoxidized core 1204, an interface between the oxidized portion and the core being defined by an extent of oxidation of the oxidized portion.

Figure 12A:
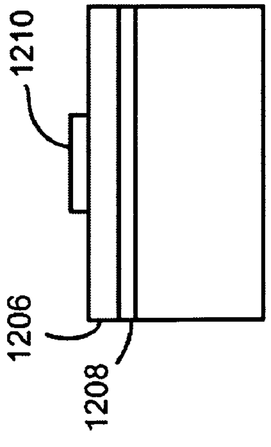
FIGS. 12A-D illustrate a process for forming a Si-containing waveguide structure according to one embodiment.
Figure 12B:
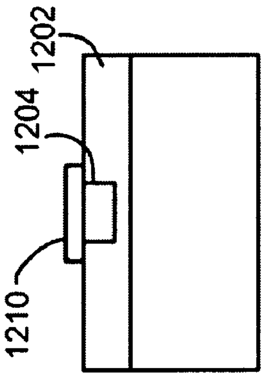
Figure 12C:
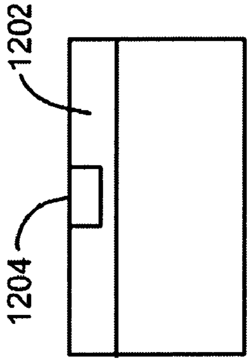
Figure 12D:
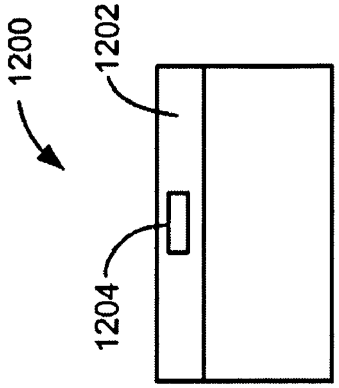

Referring to FIG. 12A, a layer 1206 of Si, preferably substantially pure Si, is formed above an insulating layer 1208. A core region of the layer of Si is masked using a mask 1210, e.g., of a nitride. Next, as shown in FIG. 12B, exposed areas of the layer of Si are oxidized for forming a core 1204 of unoxidized Si surrounded on at least two sides by SiOx 1202. Referring to FIG. 12C, the mask is removed. Then, if needed, limited oxidation is performed on the core to bury the waveguide as shown in FIG. 12D.

It should be noted that while the embodiments described above illustrate creation of a single waveguide, it will be readily apparent that arrays of waveguides may be formed on a common substrate, and that by varying processing parameters during fabrication, some or all of the waveguides on a single platform may be different than others.

Further, as implied, axial lengths of the waveguides are limited only by the processes used to fabricate them. Accordingly, waveguides of any length can be made.

Uses of the Embodiments

Embodiments of the present invention may be used in a wide variety of applications, and potentially any application in which a waveguide is useful.

Illustrative uses of various embodiments of the present invention include, but are not limited to compact, low loss optical systems on a chip for high speed, efficient, highly integrated analog and digital processing (ADCs) critical for flexible, adaptive sensors; and controlled dispersions systems for wide band communications and shape forming critical for secured communications and monitoring.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A system, comprising:

a waveguide structure having a core of AlYAs surrounded by $AlO_x$, where Y comprises one or more of Ga, In, N, and Sb, wherein an oxidation front characteristic of oxidation of a material surrounding the core to form the $AlO_x$ separates the $AlO_x$ from the core, wherein a volumetric concentration of $AlO_x$ adjacent the core in a direction parallel to a plane of deposition thereof is lower than a concentration of the AlOx in other areas of the structure, wherein the core includes a laminate of at least two unoxided layers of AlYAs having different Al concentration, each of the at least two unoxided layers of AlYAs having about a constant Al concentration across a deposition thickness thereof.

2. A system, comprising:
a waveguide structure having a core of AlYAs surrounded by $AlO_x$, where Y comprises one or more of Ga, In, N, and Sb,
wherein a volumetric concentration of $AlO_x$ adjacent the core in a direction parallel to a plane of deposition thereof is lower than a concentration of the AlOx in other areas of the structure,
wherein the core includes a laminate of at least two unoxided layers of AlYAs having different Al concentration, wherein the Al concentration steps higher or lower at interfaces of adjacent unoxidized layers.

3. The system of claim 1, wherein a thickness of the core in a direction perpendicular to a plane of deposition thereof is about the same as a width of the core in a direction parallel to the plane of deposition thereof.

4. The system of claim 2, wherein the core wherein each of the at least two unoxided layers of AlYAs has about a constant Al concentration across a deposition thickness thereof.

5. The system of claim 2, wherein a thickness of the core in a direction perpendicular to a plane of deposition thereof is about the same as a width of the core in a direction parallel to the plane of deposition thereof.

6. A system, comprising:
a waveguide structure having a core of AlYAs surrounded by $AlO_x$, where Y comprises one or more of Ga, In, N, and Sb,
wherein the core includes a laminate of at least four unoxided layers of AlYAs,
a first two of the unoxidized layers having higher Al concentrations than a second two of the unoxidized layers,
wherein the first two of the unoxidized layers sandwich one of the second two of the unoxidized layers,
wherein the second two of the unoxidized layers sandwich one of the first two of the unoxidized layers.

7. The system of claim 1, further comprising an analog or digital processing chip formed by thin film processing, the waveguide structure being formed on the chip.

8. A system, comprising:
a waveguide structure having a core of YAs surrounded by $AlO_x$, where Y is either Ga or In but not both.

9. A system, comprising:
a waveguide structure having a core of YAs surrounded by $AlO_x$, where Y in each of the materials is independently selected from a group consisting of Ga and In,
wherein a volumetric concentration of $AlO_x$ adjacent the core in a direction parallel to a plane of deposition thereof is lower than a concentration of the $AlO_x$ in other areas of the structure.

10. The system of claim 8, further comprising a chip formed by thin film processing, the waveguide structure being formed on the chip.

11. A system, comprising:
a Si-containing waveguide structure having an oxidized portion surrounding at least a portion of an unoxidized core, an interface between all portions of the oxidized portion and the core being defined by an extent of oxidation of the core.

12. The system of claim 11, wherein the core is located in a pedestal of the oxidized material.

13. The system of claim 11, wherein an interface between the oxidized portion and an underlying structure is defined by an extent of oxidation of the oxidized portion into the underlying structure.

14. The system of claim 11, wherein the core and the oxidized portion are on an insulator layer.

15. The system of claim 11, wherein the waveguide structure is formed on a chip.

16. A system, comprising:
a waveguide structure having a core of an alloy of Group III-V materials surrounded by an oxide, wherein an interface of the oxide and core is characterized by oxidation of the alloy for defining the core,
wherein the core is substantially aluminum free.

17. The system of claim 1, wherein the core is elongated, wherein a longitudinal axis of the core is parallel to a plane of deposition of the core.

18. The system of claim 17, wherein light travels through the core from one end of the core to another end of the core along the longitudinal axis.

19. The system of claim 2, wherein the core is elongated, wherein a longitudinal axis of the core is parallel to a plane of deposition of the core.

20. The system of claim 19, wherein light travels through the core from one end of the core to another end of the core along the longitudinal axis.

21. The system of claim 8, wherein a volumetric concentration of $AlO_x$ adjacent the core in a direction parallel to a plane of deposition thereof is lower than a concentration of the AlOx in other areas of the structure.

22. The system of claim 8, wherein the core is elongated, wherein a longitudinal axis of the core is parallel to a plane of deposition of the core.

23. The system of claim 22, wherein light travels through the core from one end of the core to another end of the core along the longitudinal axis.

24. The system of claim 16, wherein the core is elongated, wherein a longitudinal axis of the core is parallel to a plane of deposition of the core.

25. The system of claim 24, wherein light travels through the core from one end of the core to another end of the core along the longitudinal axis.

26. The system of claim 6, wherein the core is elongated; wherein a longitudinal axis of the core is parallel to a plane of deposition of the core.

27. The system of claim 26, wherein light travels through the core from one end of the core to another end of the core along the longitudinal axis.

28. The system of claim 6, wherein a volumetric concentration of $AlO_x$, adjacent the core in a direction parallel to a plane of deposition thereof is lower than a concentration of the AlOx in other areas of the structure.

29. The system of claim 1, wherein a thickness of the core in a direction perpendicular to a plane of deposition thereof is different than a width of the core in a direction parallel to the plane of deposition thereof.

30. The system of claim 2, further comprising an analog or digital processing chip formed by thin film processing, the waveguide structure being formed on the chip.

31. The system of claim 6, further comprising a chip formed by thin film processing, the waveguide structure being formed on the chip.

32. The system of claim 9, further comprising a chip formed by thin film processing, the waveguide structure being formed on the chip.

33. The system of claim 6, wherein each of the at least four unoxided layers of AlYAs has about a constant Al concentration across a deposition thickness thereof.

* * * * *